(12) United States Patent
Motwani et al.

(10) Patent No.: US 10,303,546 B2
(45) Date of Patent: May 28, 2019

(54) ACCESSING DATA WHEN TRANSFERRING THE DATA BETWEEN STORAGE FACILITIES

(71) Applicant: International Business Machines Corporation, Armonk, NY (US)

(72) Inventors: Manish Motwani, Chicago, IL (US); Andrew D. Baptist, Mt. Pleasant, WI (US); Ravi V. Khadiwala, Bartlett, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 374 days.

(21) Appl. No.: 15/170,404

(22) Filed: Jun. 1, 2016

(65) Prior Publication Data
US 2017/0006103 A1    Jan. 5, 2017

Related U.S. Application Data

(60) Provisional application No. 62/186,590, filed on Jun. 30, 2015.

(51) Int. Cl.
*H04L 29/08* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
None
See application file for complete search history.

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.
(Continued)

*Primary Examiner* — Natisha D Cox
(74) *Attorney, Agent, or Firm* — Garlick & Markison; Timothy W. Markison; Shayne X. Short

(57) ABSTRACT

A processing module issues a distributed agreement protocol (DAP) information to DSN storage units. The method continues with the processing module initiating, by each storage unit of a first set of the plurality of storage units, transfer of locally stored data slices to another storage unit of another set of the plurality of storage units. The method continues with the processing module, while transferring the locally stored data slices, a storage unit receiving an access request for a data slice that has been transferred, obtains the data slice by proxy from the another storage unit. The method continues with the processing module, when completing the transfer of the locally stored data slices, issuing, by each of the storage units, a DAP status to the transition coordinator and, when receiving a conformation of completion of transferring data slices by all of the storage units issuing updated DAP information.

18 Claims, 10 Drawing Sheets

(51) Int. Cl.

| | | |
|---|---|---|
| *G06F 3/06* | (2006.01) | |
| *G06F 16/22* | (2019.01) | |
| *G06F 16/27* | (2019.01) | |
| *G06F 16/2458* | (2019.01) | |
| *G06F 16/2457* | (2019.01) | |
| *G06F 11/16* | (2006.01) | |
| *H03M 13/33* | (2006.01) | |
| *H04L 29/06* | (2006.01) | |
| *H03M 13/37* | (2006.01) | |
| *H03M 13/15* | (2006.01) | |

(52) U.S. Cl.
CPC ............ *G06F 3/067* (2013.01); *G06F 3/0619* (2013.01); *G06F 11/1662* (2013.01); *G06F 16/22* (2019.01); *G06F 16/2471* (2019.01); *G06F 16/24578* (2019.01); *G06F 16/27* (2019.01); *G06F 16/273* (2019.01); *H03M 13/33* (2013.01); *H03M 13/3761* (2013.01); *H04L 65/4076* (2013.01); *H04L 67/06* (2013.01); *H04L 67/1095* (2013.01); *H04L 67/1097* (2013.01); *H04L 67/16* (2013.01); *G06F 2201/805* (2013.01); *H03M 13/1515* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2009/0210431 A1* | 8/2009 | Marinkovic .......... G06F 17/302 |
| 2010/0023524 A1 | 1/2010 | Gladwin et al. |
| 2011/0106972 A1* | 5/2011 | Grube ................... H04L 67/06 709/238 |
| 2011/0161666 A1* | 6/2011 | Gladwin ............... G06F 21/10 713/164 |
| 2011/0264989 A1* | 10/2011 | Resch ................. G06F 11/0727 714/800 |
| 2014/0281066 A1* | 9/2014 | Grube .................... G06F 3/067 710/74 |
| 2016/0179618 A1* | 6/2016 | Resch .................. H04L 63/101 714/764 |
| 2016/0292254 A1* | 10/2016 | Dhuse .............. G06F 17/30336 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 1511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner distributed computing system 10

ACCESSING DATA WHEN TRANSFERRING THE DATA BETWEEN STORAGE FACILITIES

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not applicable.

BACKGROUND OF THE INVENTION

Technical Field of the Invention

Aspects of this invention relate generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

DETAILED DESCRIPTION OF THE INVENTION

Figure 1:
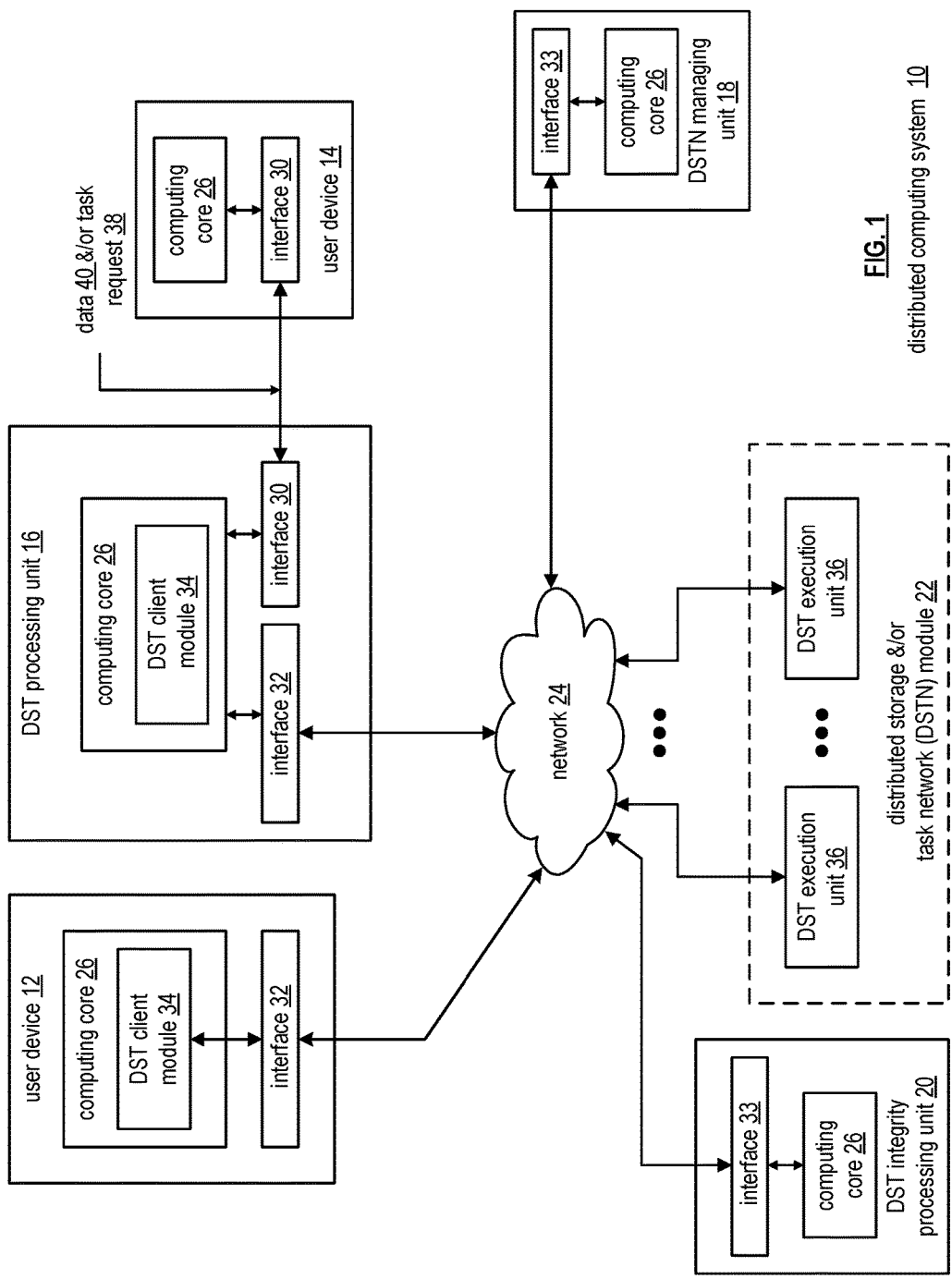
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN). Hereafter, the distributed computing system 10 may be interchangeably referred to as a dispersed storage network (DSN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, the DST execution unit may be interchangeably referred to as a storage unit and a set of DST execution units may be interchangeably referred to as a set of storage units.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval, and data storage integrity verification. In accordance with these three primary functions, data can be encoded (e.g., utilizing an information dispersal algorithm (IDA), utilizing a dispersed storage error encoding process), distributedly stored in physically different locations, and subsequently retrieved in a reliable and secure manner. Hereafter, distributedly stored may be interchangeably referred to as dispersed stored. Such a system is tolerant of a significant number of failures (e.g., up to a failure level, which may be greater than or equal to a pillar width (e.g., an IDA width of the IDA) minus a decode threshold minus one) that may result from individual storage device (e.g., DST execution unit 36) failures and/or network equipment failures without loss of data and without the need for a redundant or backup copy. Further, the distributed computing system 10 allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block associated with a portion of an overall namespace of the DSN) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated system registry information in one or more of the DSTN module 22, the user device 12, the DST processing unit 16, and the DST integrity processing unit 20.

The DS error encoding parameters (e.g., or dispersed storage error coding parameters for encoding and decoding) include data segmenting information (e.g., how many segments data (e.g., a file, a group of files, a data block, etc.) is divided into), segment security information (e.g., per segment encryption, compression, integrity checksum, etc.), error coding information (e.g., pillar/IDA width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

Each slice name is unique to a corresponding encoded data slice and includes multiple fields associated with the overall namespace of the DSN. For example, the fields may include a pillar number/pillar index, a vault identifier, an object number uniquely associated with a particular file for storage, and a data segment identifier of a plurality of data segments, where the particular file is divided into the plurality of data segments. For example, each slice name of a set of slice names corresponding to a set of encoded data slices that has been dispersed storage error encoded from a common data segment varies only by entries of the pillar number field as each share a common vault identifier, a common object number, and a common data segment identifier.

To support distributed task processing on received data, the distributed computing system 10 has two primary operations: DST (distributed storage and/or task processing) management and DST execution on received data. With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. With respect to the DST management, it is substantially similar to the DST management to support distributed task processing on received data.

Figure 2:
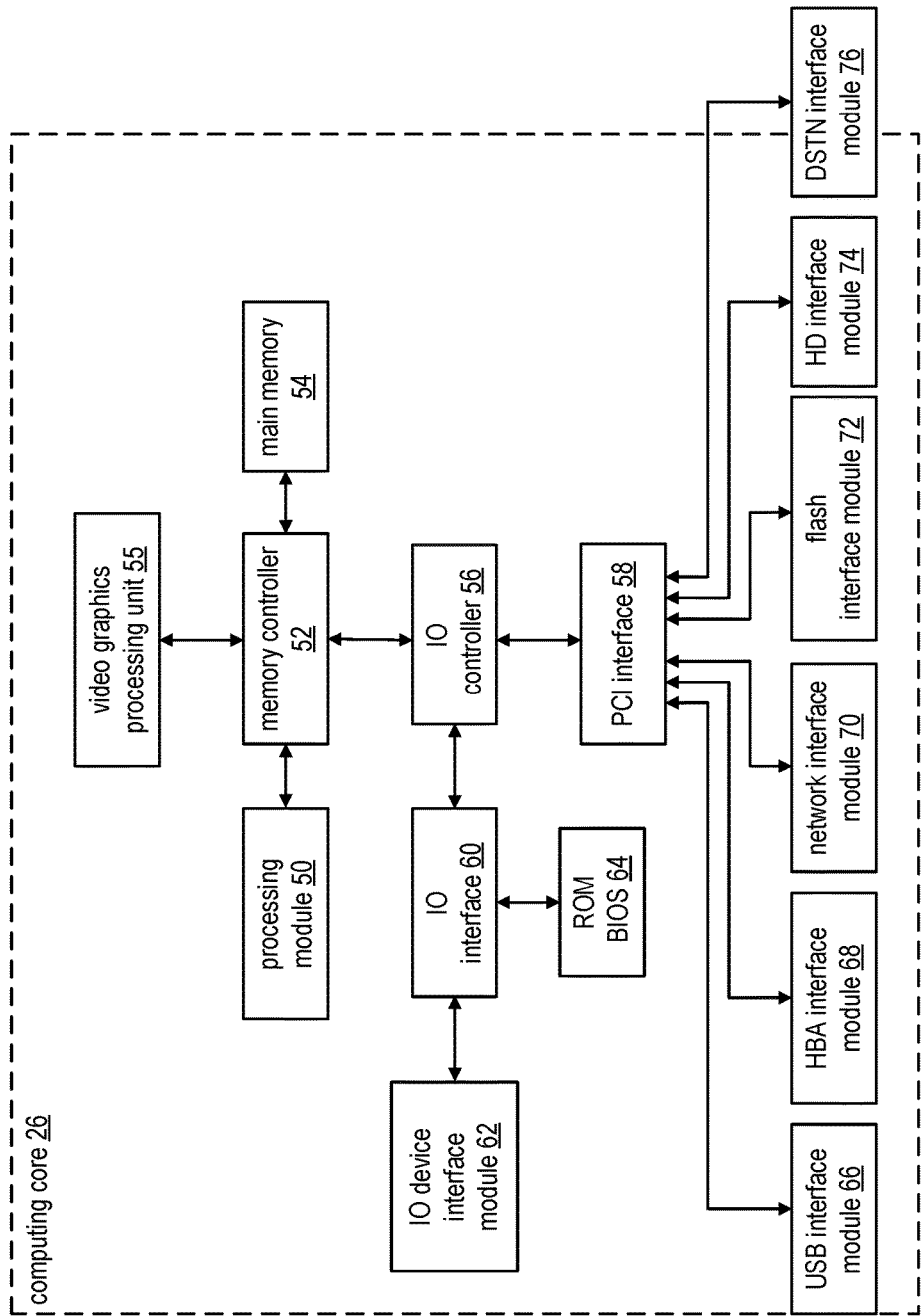
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3A:
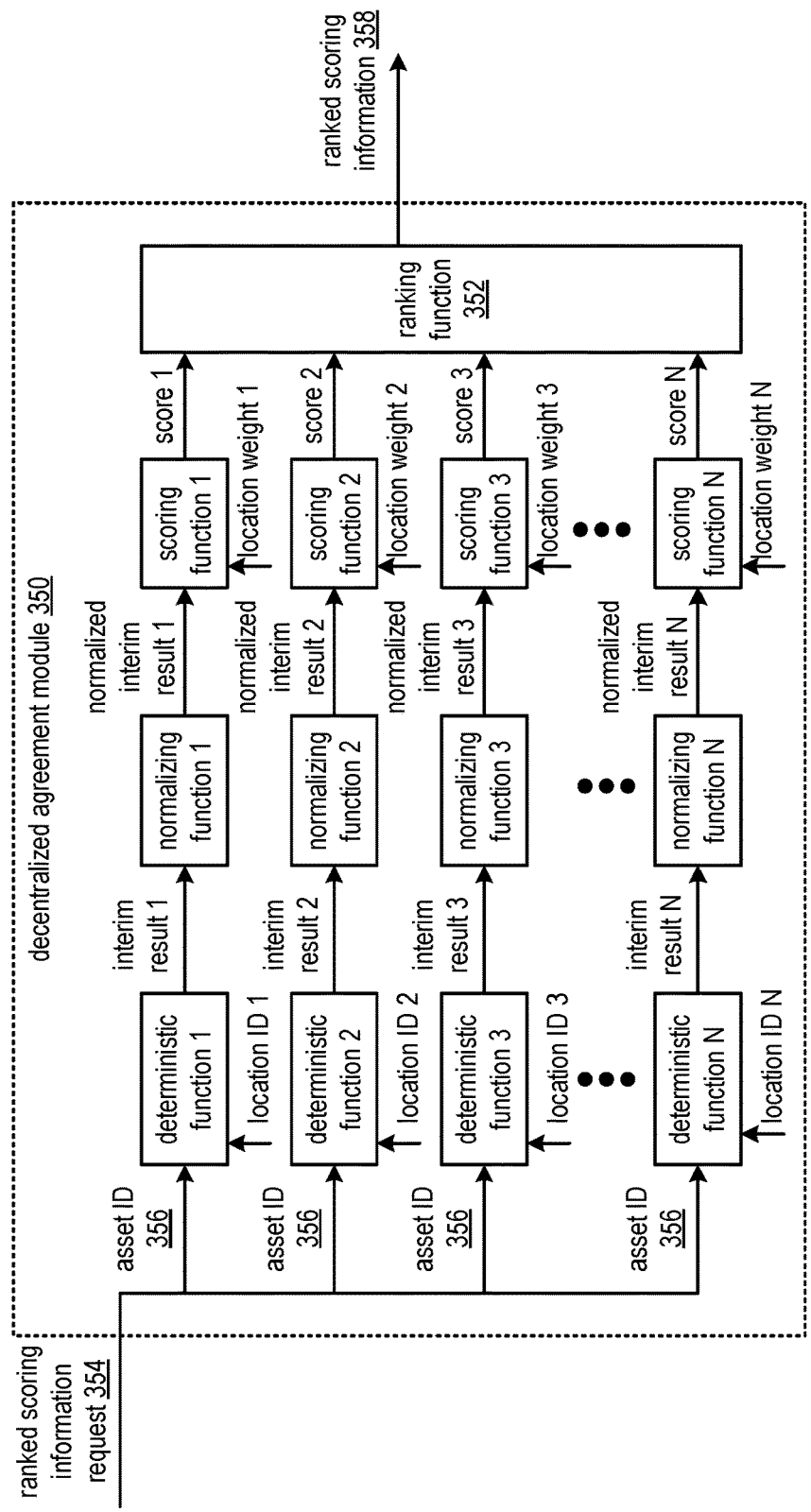
FIG. 3A is a schematic block diagram of an embodiment of a decentralized agreement module in accordance with the present invention.

FIG. 3A is a schematic block diagram of an embodiment of a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing the processing module 50 of FIG. 2. The decentralized agreement module 350 may be implemented utilizing any module and/or unit of a dispersed storage network (DSN). For example, the decentralized agreement module is implemented utilizing the distributed storage and task (DST) client module 34 of FIG. 1.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DST client module 34 of FIG. 1, a DST processing unit 16 of FIG. 1, a DST integrity processing unit 20 of FIG. 1, a DSTN managing unit 18 of FIG. 1, a user device 12 of FIG. 1, and a user device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc. the given asset of the request). Having generated the ranked scoring information 358, the decentralized agreement module 350 outputs the ranked scoring information 358 to the requesting entity.

Figure 3B:
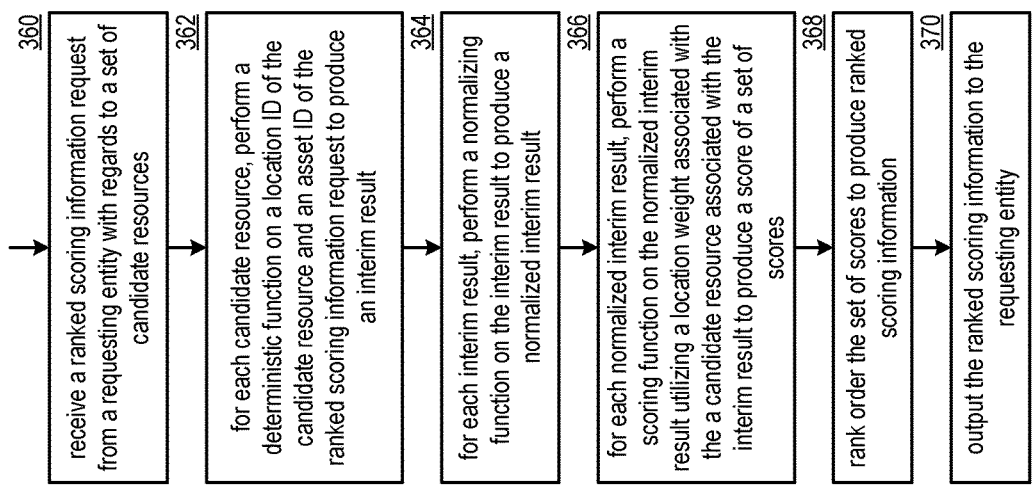
FIG. 3B is a flowchart illustrating an example of selecting the resource in accordance with the present invention.

FIG. 3B is a flowchart illustrating an example of selecting a resource. The method begins or continues at step 360 where a processing module (e.g., of a decentralized agreement module) receives a ranked scoring information request from a requesting entity with regards to a set of candidate resources. For each candidate resource, the method continues at step 362 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 364 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 366 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 368 where the processing module rank orders the set of scores to produce ranked scoring information (e.g., ranking a highest value first). The method continues at step 370 where the processing module outputs the ranked scoring information to the requesting entity. The requesting entity may utilize the ranked scoring information to select one location of a plurality of locations.

Figure 3C:
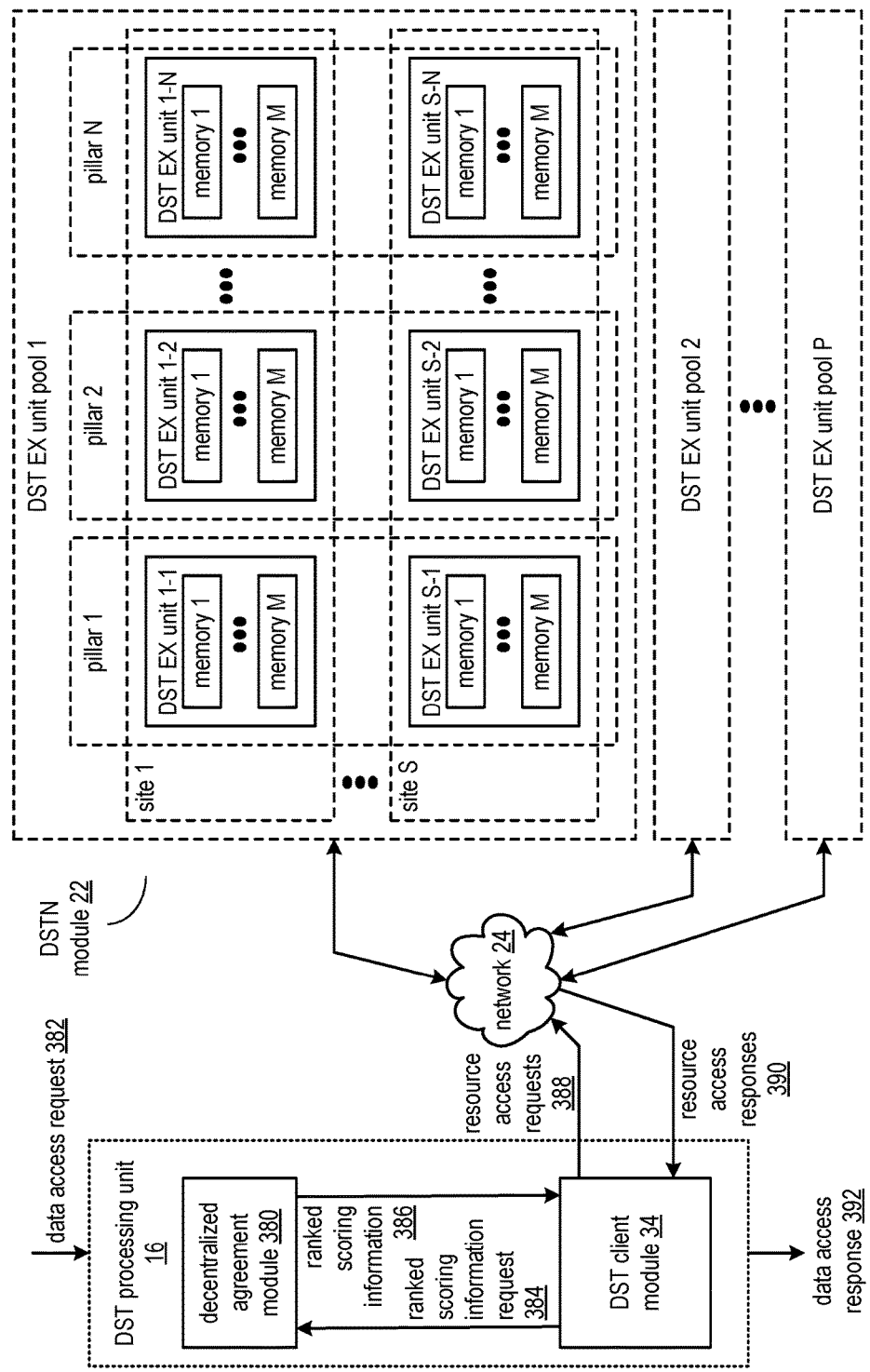
FIG. 3C is a schematic block diagram of an embodiment of a dispersed storage network (DSN) in accordance with the present invention.

FIG. 3C is a schematic block diagram of an embodiment of a dispersed storage network (DSN) that includes the distributed storage and task (DST) processing unit 16 of FIG. 1, the network 24 of FIG. 1, and the distributed storage and task network (DSTN) module 22 of FIG. 1. Hereafter, the DSTN module 22 may be interchangeably referred to as a DSN memory. The DST processing unit 16 includes a decentralized agreement module 380 and the DST client module 34 of FIG. 1. The decentralized agreement module 380 be implemented utilizing the decentralized agreement module 350 of FIG. 3A. The DSTN module 22 includes a plurality of DST execution (EX) unit pools 1-P. Each DST execution unit pool includes one or more sites 1-S. Each site includes one or more DST execution units 1-N. Each DST execution unit may be associated with at least one pillar of N pillars associated with an information dispersal algorithm (IDA), where a data segment is dispersed storage error encoded using the IDA to produce one or more sets of encoded data slices, and where each set includes N encoded data slices and like encoded data slices (e.g., slice 3's) of two or more sets of encoded data slices are included in a common pillar (e.g., pillar 3). Each site may not include every pillar and a given pillar may be implemented at more than one site. Each DST execution unit includes a plurality of memories 1-M. Each DST execution unit may be implemented utilizing the DST execution unit 36 of FIG. 1. Hereafter, a DST execution unit may be referred to interchangeably as a storage unit and a set of DST execution units may be interchangeably referred to as a set of storage units and/or as a storage unit set.

The DSN functions to receive data access requests 382, select resources of at least one DST execution unit pool for data access, utilize the selected DST execution unit pool for the data access, and issue a data access response 392 based on the data access. The selecting of the resources includes utilizing a decentralized agreement function of the decentralized agreement module 380, where a plurality of locations are ranked against each other. The selecting may include selecting one storage pool of the plurality of storage pools, selecting DST execution units at various sites of the plurality of sites, selecting a memory of the plurality of memories for each DST execution unit, and selecting combinations of memories, DST execution units, sites, pillars, and storage pools.

In an example of operation, the DST client module 34 receives the data access request 382 from a requesting entity, where the data access request 382 includes at least one of a store data request, a retrieve data request, a delete data request, a data name, and a requesting entity identifier (ID). Having received the data access request 382, the DST client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory, from a dispersed hierarchical index) based on the data name (e.g., for the retrieve data request).

Having determined the DSN address, the DST client module 34 selects a plurality of resource levels (e.g., DST EX unit pool, site, DST execution unit, pillar, memory) associated with the DSTN module 22. The determining may be based on one or more of the data name, the requesting entity ID, a predetermination, a lookup, a DSN performance indicator, and interpreting an error message. For example, the DST client module 34 selects the DST execution unit pool as a first resource level and a set of memory devices of a plurality of memory devices as a second resource level based on a system registry lookup for a vault associated with the requesting entity.

Having selected the plurality of resource levels, the DST client module 34, for each resource level, issues a ranked scoring information request 384 to the decentralized agreement module 380 utilizing the DSN address as an asset ID. The decentralized agreement module 380 performs the decentralized agreement function based on the asset ID (e.g., the DSN address), identifiers of locations of the selected resource levels, and location weights of the locations to generate ranked scoring information 386.

For each resource level, the DST client module 34 receives corresponding ranked scoring information 386. Having received the ranked scoring information 386, the DST client module 34 identifies one or more resources associated with the resource level based on the rank scoring information 386. For example, the DST client module 34 identifies a DST execution unit pool associated with a highest score and identifies a set of memory devices within DST execution units of the identified DST execution unit pool with a highest score.

Having identified the one or more resources, the DST client module 34 accesses the DSTN module 22 based on the identified one or more resources associated with each resource level. For example, the DST client module 34 issues resource access requests 388 (e.g., write slice requests when storing data, read slice requests when recovering data) to the identified DST execution unit pool, where the resource access requests 388 further identify the identified set of memory devices. Having accessed the DSTN module 22, the DST client module 34 receives resource access responses 390 (e.g., write slice responses, read slice responses). The DST client module 34 issues the data access response 392 based on the received resource access responses 390. For example, the DST client module 34 decodes received encoded data slices to reproduce data and generates the data access response 392 to include the reproduced data.

Figure 3D:
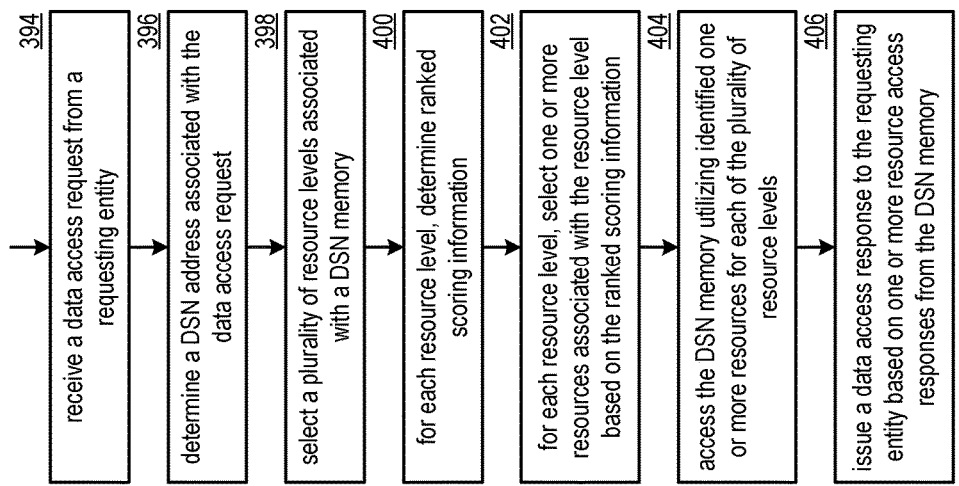
FIG. 3D is a flowchart illustrating an example of accessing a dispersed storage network (DSN) memory in accordance with the present invention.

FIG. 3D is a flowchart illustrating an example of accessing a dispersed storage network (DSN) memory. The method begins or continues at step 394 where a processing module (e.g., of a distributed storage and task (DST) client module) receives a data access request from a requesting entity. The data access request includes one or more of a storage request, a retrieval request, a requesting entity identifier, and a data identifier (ID). The method continues at step 396 where the processing module determines a DSN address associated with the data access request. For example, the processing module generates the DSN address for the storage request. As another example, the processing module performs a lookup for the retrieval request based on the data identifier.

The method continues at step 398 where the processing module selects a plurality of resource levels associated with the DSN memory. The selecting may be based on one or more of a predetermination, a range of weights associated with available resources, a resource performance level, and a resource performance requirement level. For each resource level, the method continues at step 400 where the processing module determines ranked scoring information. For example, the processing module issues a ranked scoring information request to a decentralized agreement module based on the DSN address and receives corresponding ranked scoring information for the resource level, where the decentralized agreement module performs a decentralized agreement protocol function on the DSN address using the associated resource identifiers and resource weights for the resource level to produce the ranked scoring information for the resource level.

For each resource level, the method continues at step 402 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 404 where the processing module accesses the DSN memory utilizing the selected one or more resources for each of the plurality of resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 406 where the processing module issues a data access response to the requesting entity based on one or more resource access responses from the DSN memory. For example, the processing module issues a data storage status indicator when storing data. As another example, the processing module generates the data access response to include recovered data when retrieving data.

Figure 4:
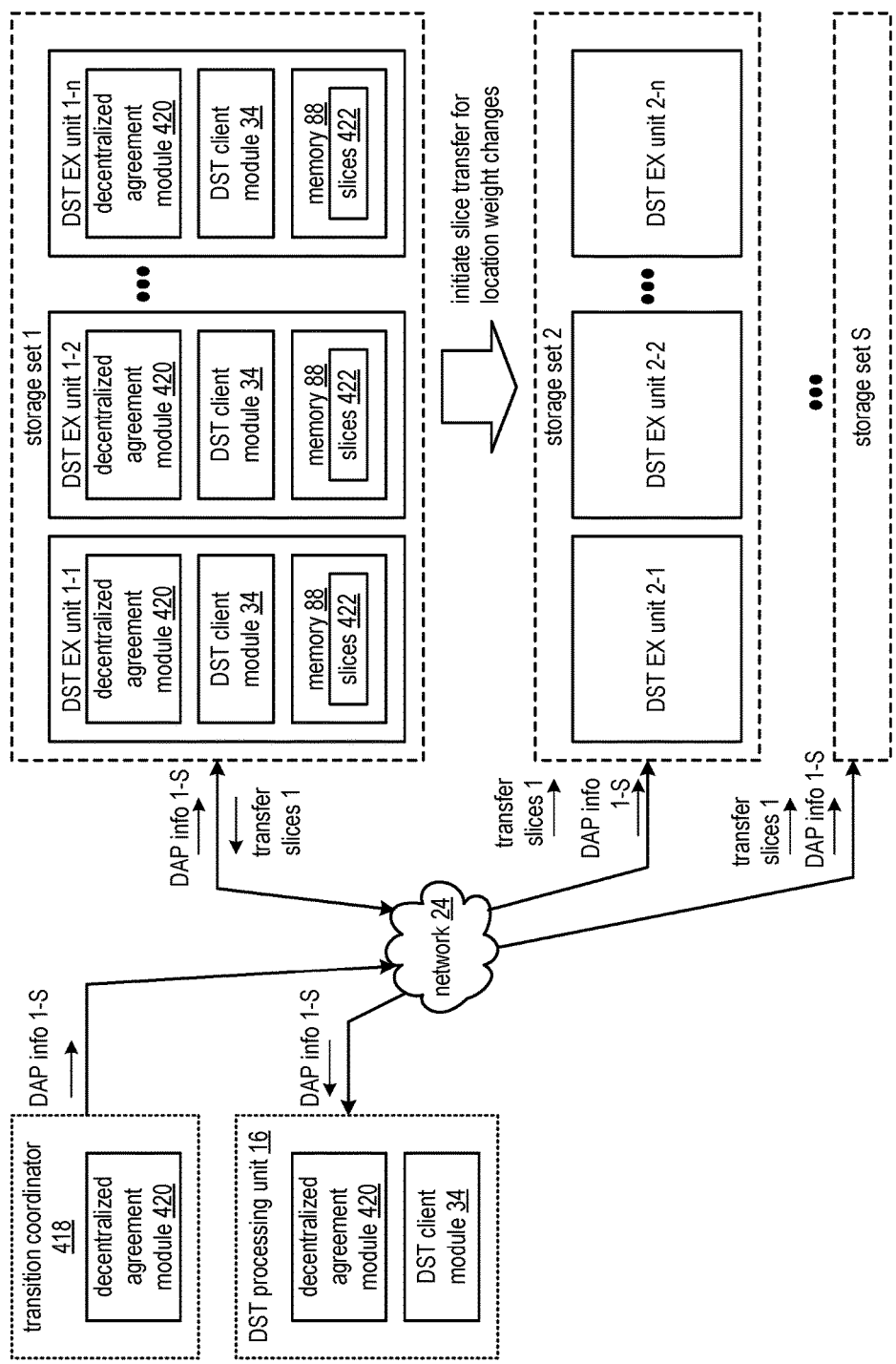
FIGS. 4-6 are schematic block diagrams of an embodiment of a dispersed storage network (DSN) in accordance with the present invention.
Figure 5:
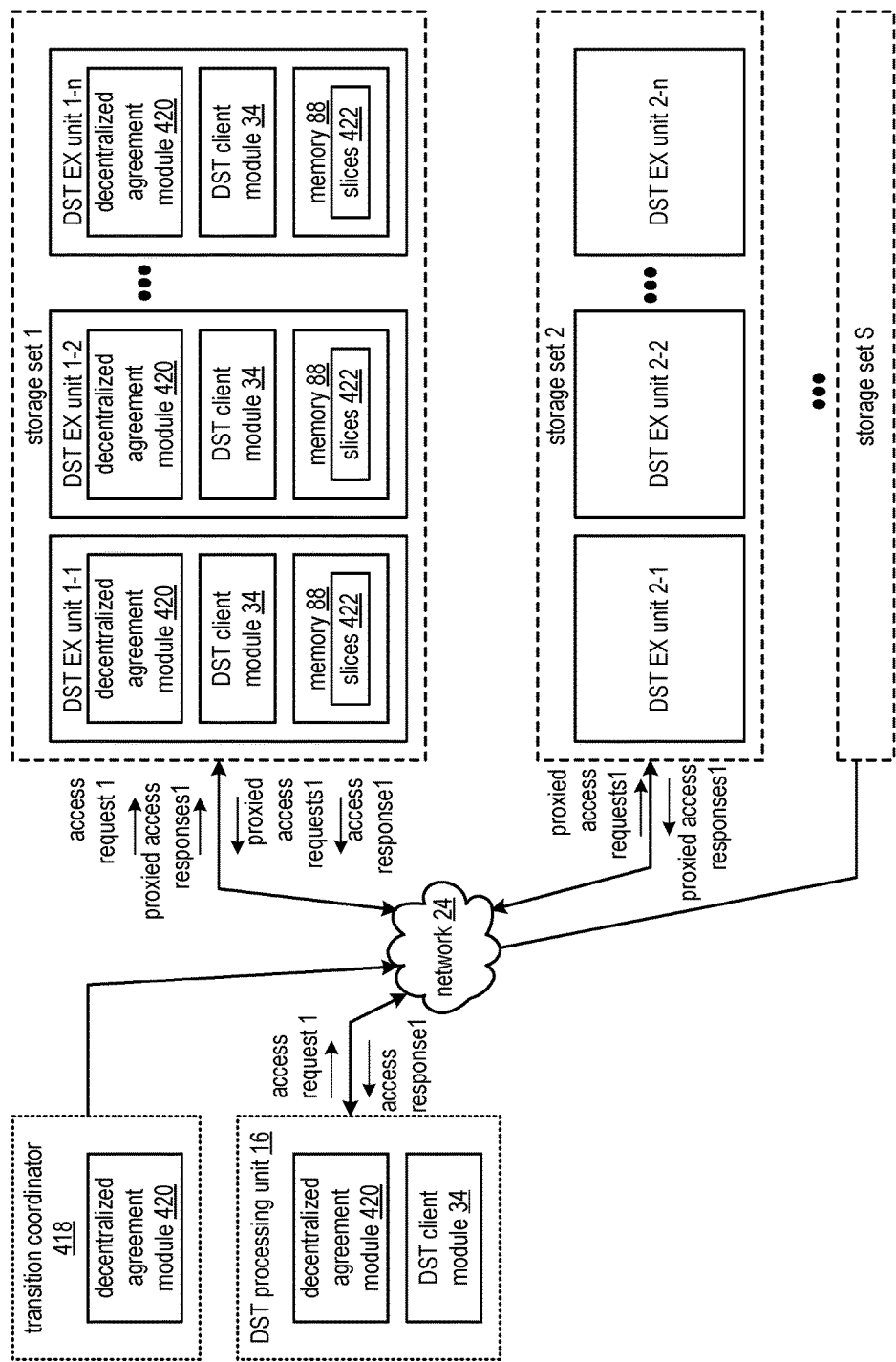
Figure 6:
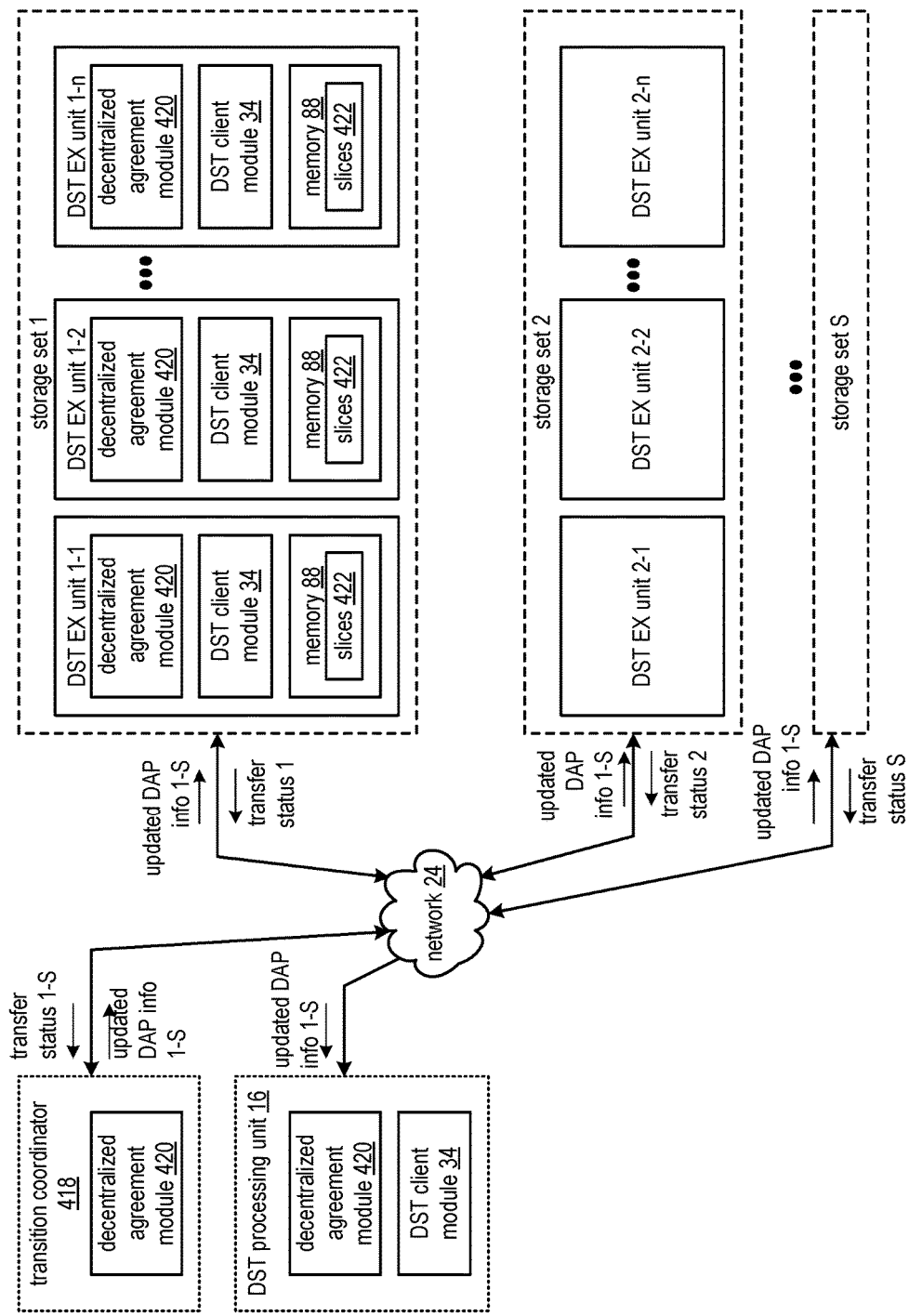

FIGS. 4-6 are schematic block diagrams of an embodiment of a dispersed storage network (DSN) that includes a transition coordinator.

In this embodiment, within a DSN memory, a Distributed Agreement Protocol (DAP) may be used to determine which ds units (or sets of ds units) are responsible for a given slice or source name. A primary utility of the DAP is that it enables properties of the system to change (e.g., new sets of ds units to be added, removed, expanded or shrunk) with minimal interruption and data movement required to restore equilibrium and place all slices where they belong. Within the DSN, the following procedure (discussed in greater detail in FIGS. 4-7) is used among a transition coordinator, the set of ds units, and the ds processing units.

The process begins by starting with a former or "old" system configuration, which is known and used by all ds units and ds processing units for the determination of which ds unit or set of ds units is responsible for a given slice name. At a future time, the DSN memory is adapted, e.g. by adding a new set of ds units to the system. This necessitates a change to the system configuration, but the change must be managed in a certain manner to maintain full availability for all slices.

During the transition process, the transition coordinator continues to publish the old system configuration to the ds processing units, the intended transition, including a specification of the old system configuration, and the intended new system configuration. The ds units continue to process access requests according to the old system configuration, and reject access requests for slices which they would be responsible for according to the new system configuration, but not under the old system configuration.

As the ds units begin to relocate slices to the locations they belong according to the new system configuration the ds units proxy access requests for slices that belong to alternate locations according to the new system configuration, and which have already been relocated to those new locations.

Once the ds units complete the relocation of all slices, the transition coordinator, when notified by each ds unit that it has completed relocation of all its slices, will then publish the new system configuration to ds processing units. The ds processing units will then begin to use the new system configuration to access slices from their current locations directly and at this time may cease to proxy slice access requests, and ds units that receive proxied access requests may begin to reject them.

FIG. 4 is a schematic block diagram of another embodiment of a dispersed storage network (DSN) that includes a transition coordinator 418, the distributed storage and task (DST) processing unit 16 of FIG. 1, the network 24 of FIG. 1, and a plurality of storage sets 1-S. The transition coordinator 418 may be implemented utilizing one or more of a DST processing unit 16, the user device, a server, and a storage unit. The DST processing unit 16 includes a decentralized agreement module 420 and the DST client module 34 of FIG. 1. The decentralized agreement module 420 may be implemented utilizing the decentralized agreement module 350 of FIG. 3A. Each storage set includes a set of DST execution (EX) units 1-n. Each DST execution unit includes decentralized agreement module 420, DST client module 34 of FIG. 1, and a memory 88. The memory 88 may be implemented utilizing one or more of solid-state memory, magnetic disk drive memory, optical disk drive memory, etc. Each DST execution unit may be implemented utilizing the DST execution unit 36 of FIG. 1. Hereafter, each DST execution unit may be interchangeably referred to as a storage unit and each storage set may be interchangeably referred to as a set of storage units. The DSN functions to coordinate transfer and access of stored data between storage facilities, where the data is dispersed storage error encoded to produce one or more sets of encoded data slices where encoded data slice of each set of encoded data slices 422 stored in the memory 88 of each storage unit.

In an example of operation of the coordinating of the transfer and access of the stored data, the transition coordinator issues distributed agreement protocol (DAP) information to entities of the DSN, where the DAP information includes current system configuration and next configuration (e.g., resource weighting factors associated with resource selection utilizing a DAP function). For example, the distributed agreement module generates DAP information 1-S for the S storage sets and sends, via the network 24, the DAP information 1-S to storage units of the storage sets 1-S.

Having received the DAP information, each storage unit initiates transfer of any locally stored encoded data slices to another storage unit, where the encoded data slices are associated with the storage unit in accordance with the current system configuration but not with the next configuration and where the slices are associated with the other storage unit in accordance with the next configuration. For example, the DST execution unit 1-1 performs the distributed agreement protocol function on a slice name of an encoded data slice stored in the memory 88 of the DST execution unit 1-1 to identify DST execution unit 2-1 (e.g., as the other storage unit) and when transferring, issues, via the network 24, a write slice request to the DST execution unit 2-1 that includes the encoded data slice.

FIG. 5 is a schematic block diagram of another embodiment of a dispersed storage network (DSN) that includes a transition coordinator 418, the distributed storage and task (DST) processing unit 16 of FIG. 1, the network 24 of FIG. 1, and a plurality of storage sets 1-S. Continuing discussion from FIG. 4, while transferring an encoded data slice, a storage unit receiving an access request for an encoded data slice that is being transferred, obtains the encoded data slice from the other storage unit. For example, the DST execution unit 1-1 receives, via the network 24, an access request 1 from the DST processing unit 16, utilizes the DAP function on a requested slice name of the access request to identify the DST execution unit 2-1, issues, via the network 24, a proxied access request 1 to the DST execution unit 2-1, receives, via the network 24, a proxied access response 1 from the DST execution unit 2-1, and issues, via the network 24, an access response 1 to the DST processing unit 16 based on the received proxied access response 1 (e.g., a write status response, and a retrieved encoded data slice).

FIG. 6 is a schematic block diagram of another embodiment of a dispersed storage network (DSN) that includes a transition coordinator 418, the distributed storage and task (DST) processing unit 16 of FIG. 1, the network 24 of FIG. 1, and a plurality of storage sets 1-S. Continuing discussion from FIG. 5, each storage unit, when completing the transfer of the locally stored encoded data slices, issues a DAP status to the transition coordinator. For example, storage units of the storage set 2 issue, via the network 24, transfer status 2 to the transition coordinator indicating completion of receiving transfer encoded data slices. As another example, storage units of the storage set 1 issue, via the network 24, transfer status 1 to the transition coordinator indicating completion of sending the transfer encoded data slices. When receiving confirmation of completion of the transferring of encoded data slices by substantially all of the storage units associated with the transferring of the encoded data slices, the transition coordinator issues, via the network 24, updated DAP information that indicates that the next configuration is now the current system configuration.

Figure 7:
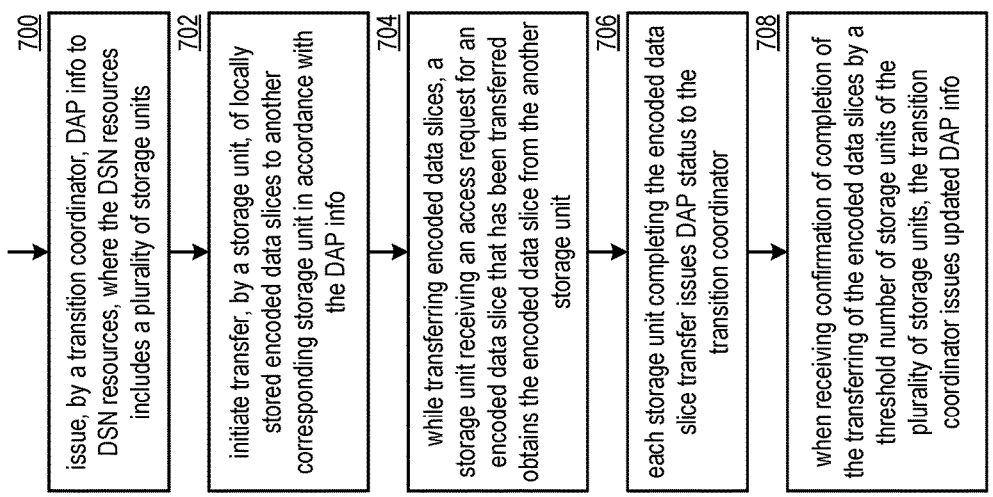
FIG. 7 is a flowchart illustrating an example of data slice movement to new storage sets in accordance with the present invention.

FIG. 7 is a flowchart illustrating an example of data slice movement to new storage sets in accordance with the present invention. In particular, a method is presented for use in conjunction with one or more functions and features described in conjunction with FIGS. 1-2, 3A-D, 4-6, and also FIG. 7.

The method begins at a step 700 where a transition coordinator issues distributed agreement protocol (DAP) information to dispersed storage network (DSN) resources, where the DSN resources includes a plurality of storage units. For example, the transition coordinator identifies DSN resources that utilize the DAP information, generates a DAP information message, and sends the DAP information message to the identified DSN resources.

The method continues at the step 702 where each storage unit initiates transfer of locally stored encoded data slices to another corresponding storage unit in accordance with the DAP information. For example, the storage unit performs a distributed agreement protocol function on a slice name of a stored encoded data slice to identify the other storage unit in accordance with the next system configuration information, and when transferring, issues a write slice request to the other storage unit, where the write slice request includes the encoded data slice.

While transferring encoded data slices, the method continues at the step 704, where a storage unit receiving an access request for an encoded data slice that has been transferred, obtains the encoded data slice from the other storage unit. For example, the receiving storage unit issues a proxied access requests to the other storage unit, receives a proxied access response, and issues an access response to a requesting entity.

The method continues at the step 706 where each storage unit, completing the encoded data slice transfer, issues a DAP status to the transition coordinator. For example, the completing storage unit generates the DAP status to indicate completion of the transfer of encoded data slices such that all locally stored encoded data slices adhere to the next system configuration information.

When receiving confirmation of completion of the transferring of encoded data slices by a threshold number of storage units of the plurality of storage units, the method continues at the step 708 where the transition coordinator issues updated DAP information. For example, the transition coordinator generates the updated DAP information to indicate that the next system configuration is now a current system configuration, identifies the DSN resources that utilize the DAP information, and sends the updated DAP information to the identify DSN resources (e.g., publishes as part of system registry information, issues separate update messages, etc.).

The method described above in conjunction with the computing device and the storage units can alternatively be performed by other modules of the dispersed storage network or by other devices. For example, any combination of a first module, a second module, a third module, a fourth module, etc. of the computing device and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by one or more processing modules of one or more computing devices of a dispersed storage network (DSN), the method comprises:
    issuing, by a transition coordinator, distributed agreement protocol (DAP) information to DSN resources, where the DSN resources include a plurality of storage units, and wherein the DAP information includes a current system configuration and a next system configuration;
    initiating, by each storage unit of a first set of the plurality of storage units, transfer of locally stored data slices to another storage unit of another set of the plurality of storage units;
    while transferring the locally stored data slices, a storage unit receiving an access request for a data slice that has been transferred, obtains the data slice by proxy from the another storage unit;
    when completing the transfer of the locally stored data slices, issuing, by each of the storage units, a DAP status to the transition coordinator; and
    when receiving a conformation of completion of transferring data slices by all of the storage units issuing, by the transition coordinator, updated DAP information.

2. The method of claim 1, wherein the current system configuration and next system configuration each include weighting factors for the DSN resources.

3. The method of claim 1, wherein, before issuing the updated DAP information, the data slices are associated with the storage unit of the first set in accordance with the current system configuration, but not the next configuration.

4. The method of claim 3, wherein, after issuing the updated DAP information, the data slices are associated with the storage unit of the another set in accordance the next system configuration, which is now a current system configuration.

5. The method of claim 1, wherein, before the transfer, a DAP function is performed for each data slice name of a data slice to identify the another storage unit.

6. The method of claim 1, wherein the obtaining includes issuing a proxied access request to the another storage unit, receiving a proxy access response and issuing an access response to a requesting entity.

7. The method of claim 1, wherein the DAP status includes a completion indicator.

8. A dispersed storage (DS) module comprises:
   a first module, when operable within a computing device, causes the computing device to:
      issue, by a transition coordinator, distributed agreement protocol (DAP) information to distributed storage network (DSN) resources, where the DSN resources include a plurality of storage units, and wherein the DAP information includes a current system configuration and a next system configuration;
   a second module, when operable within the computing device, causes the computing device to:
      initiate transfer, by each storage unit, of locally stored encoded data slices to another corresponding storage unit in accordance with the DAP information;
   a third module, when operable within the computing device, causes the computing device to:
      while transferring encoded data slices and a storage unit receiving an access request for an encoded data slice that has been transferred, obtain the encoded data slice by proxy from the another storage unit;
   a fourth module, when operable within the computing device, causes the computing device to:
      when each storage unit completes the encoded data slice transfer, issue a DAP status to the transition coordinator; and
   a fifth module, when operable within the computing device, causes the computing device to:
      when receiving confirmation of completion of the transferring of the encoded data slices by a threshold number of storage units of the plurality of storage units, issue, by the transition coordinator, updated DAP information.

9. The dispersed storage (DS) module of claim 8, wherein the current system configuration and next system configuration each include weighting factors for the DSN resources.

10. The dispersed storage (DS) module of claim 8, wherein the encoded data slices are associated with the storage unit in accordance with the current system configuration but not the next configuration.

11. The dispersed storage (DS) module of claim 8, wherein, before issuing the updated DAP information, the data slices are associated with the storage unit in accordance with the current system configuration, but not the next configuration.

12. The dispersed storage (DS) module of claim 8, wherein after issuing the updated DAP information, the data slices are associated with the another storage unit in accordance the next system configuration, which is now a current system configuration.

13. The dispersed storage (DS) module of claim 8, wherein, before the transfer, a DAP function is performed for each data slice name of a data slice to identify the another storage unit.

14. The dispersed storage (DS) module of claim 8, wherein the obtaining of the encoded data slice from the another storage unit includes issuing a proxied access request to the another storage unit, receiving a proxy access response and issuing an access response to a requesting entity.

15. The dispersed storage (DS) module of claim 8, wherein the DAP status includes a completion indicator.

16. A computing device of a group of computing devices of a dispersed storage network (DSN), the computing device comprises:
   an interface;
   a local memory; and
   a processing module operably coupled to the interface and the local memory, wherein the processing module functions to:
      identify distributed storage network (DSN) resources that utilize distributed agreement protocol (DAP) information, generate a DAP information message and send the DAP information message to the identified DSN resources, the DAP information message identifying another storage unit to transfer encoded data slices to in accordance with a next system configuration information;
      issue write slice requests to transfer the encoded data slices to the another storage unit, where the write slice request includes the encode data slices;
      during the transfer of the encoded data slices, issue a proxied encoded data slice access request to the another storage unit for all requests to the transferring encoded data slices;
      generate a DAP status to indicate completion of the transfer of the encoded data slices to conform with the next system configuration information;
      generate updated DAP information to indicate that a next system configuration is now a current system configuration;
      identify the DSN resources that utilize the updated DAP information; and
      send the updated DAP information to the identified DSN resources.

17. The computing device of claim 16, wherein the processing module further functions to
   publish as part of a system registry the updated DAP information.

18. The computing device of claim 16, wherein the processing module further functions to
   issue separate updated DAP information messages.

* * * * *